United States Patent
Kato et al.

(10) Patent No.: US 6,218,069 B1
(45) Date of Patent: Apr. 17, 2001

(54) PHOTOSENSITIVE RESIN COMPOSITION AND MAKING PROCESS

(75) Inventors: Hideto Kato; Tomoyoshi Furihata; Satoshi Okazaki, all of Usui-gun (JP)

(73) Assignee: Shin-Etsu Chemical Co. Ltd., Tokyo (JP)

( * ) Notice: Subject to any disclaimer, the term of this patent is extended or adjusted under 35 U.S.C. 154(b) by 0 days.

(21) Appl. No.: 09/480,627

(22) Filed: Jan. 10, 2000

(30) Foreign Application Priority Data

Jan. 11, 1999 (JP) .................................. 11-004528

(51) Int. Cl.$^7$ ........................................... G03F 7/023
(52) U.S. Cl. .................... 430/190; 430/191; 430/192; 430/193
(58) Field of Search .................................. 430/190, 191, 430/192, 193

(56) References Cited

U.S. PATENT DOCUMENTS

| | | | |
|---|---|---|---|
| 5,279,918 | * 1/1994 | Nishi et al. | 430/190 |
| 5,422,221 | * 6/1995 | Okazaki et al. | 430/190 |
| 5,679,495 | * 10/1997 | Yamachika et al. | 430/191 |

FOREIGN PATENT DOCUMENTS

| | | |
|---|---|---|
| 45-9610 | 4/1970 | (JP) . |
| 63-236030 | 9/1988 | (JP) . |
| 63-237053 | 10/1988 | (JP) . |
| 9-230592 | 9/1997 | (JP) . |
| 9-236923 | 9/1997 | (JP) . |

OTHER PUBLICATIONS

English abstract of JP–B 45–9610.
English abstract of JP–A 63–236030.
English abstract of JP–A 63–237053.
English abstract of JP–A 9–230592.
English abstract of JP–A 9–236923.

* cited by examiner

*Primary Examiner*—John S. Chu
(74) *Attorney, Agent, or Firm*—Millen, White, Zelano & Branigan, P.C.

(57) ABSTRACT

A photosensitive resin composition contains a photosensitive resin comprising recurring units of formula (1) and having a Mw of 1,300–11,000 and 20–5,000 ppm of a tertiary amine compound of formula (2).

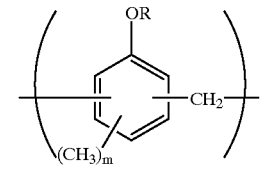

(1)

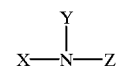

(2)

R is hydrogen or a 1,2-naphthoquinonediazido-5-sulfonic acid residue, the content of 1,2-naphthoquinonediazido-5-sulfonic acid residue in R is 3–27 mol %, and m is a number from 0 to 3, X is a $C_{6-20}$ alkyl, aryl or aralkyl group, Y and Z each are a $C_{1-20}$ alkyl group. The composition is improved in sensitivity stability and adhesion to substrates and eliminates the risk of causing corrosion of metal substrates.

3 Claims, No Drawings

PHOTOSENSITIVE RESIN COMPOSITION AND MAKING PROCESS

This invention relates to a photosensitive resin composition and a process for preparing the same.

BACKGROUND OF THE INVENTION

The majority of resist compositions currently used for the preparation of semiconductor devices are positive working resist compositions. Negative working resist compositions using cyclized rubber are difficult to increase resolution because organic solvents used as the developer cause significant swelling. By contrast, positive working resist compositions are developed with aqueous base solutions, which eliminates the swelling problem and affords superior resolution. The positive working resist compositions can thus accommodate for the desired high integration of semiconductor devices.

Most of positive resist compositions are comprised of an alkali-soluble phenolic resin and a photosensitive agent such as quinonediazidosulfonic acid ester. These positive resist compositions suffer from the precipitation of foreign matter during long-term storage because many photosensitive agents are insufficiently soluble in solvents.

To eliminate the above drawback, JP-B 45-9610 proposes a photosensitive resin having quinonediazido-sulfonic acid groups directly incorporated in an alkali-soluble resin at hydroxyl groups thereon. Since this photosensitive resin is prepared using a basic catalyst for condensation such as triethylamine, a salt of the catalyst such as the hydrochloride salt of triethylamine forms as a by-product. If a photosensitive resin composition is formulated using the photosensitive resin with the salt left therein, the use of the composition entails the problem that the salt can cause corrosion of aluminum or other metal substrates.

For preventing any loss of characteristics of the photosensitive resin by the presence of the basic catalyst itself and the salt thereof by-produced, it is proposed in JP-A 63-236030 to purify the photosensitive resin product to remove the basic catalyst and the salt thereof. This purifying and removal step is complex, cumbersome and industrially disadvantageous.

It is known from JP-A 63-237053, 9-230592 and 9-236923 that the presence of certain basic compounds in positive photoresist compositions is effective for improving the shelf stability and adhesion to substrates of the resist compositions. This suggests that if not only the salt of the basic catalyst, but the residual base are removed by the above-mentioned purifying and removal step so that only an extremely reduced amount of residual base is available, there can arise a problem that the adhesion to substrates of the resist composition, which is one of key functions, is aggravated.

SUMMARY OF THE INVENTION

An object of the invention is to provide a novel and improved photosensitive resin composition which is superior in sensitivity stability, does not cause corrosion of metal substrates, and has improved adhesion to substrates. Another object of the invention is to provide a process for preparing such an improved photosensitive resin composition.

The invention is predicated on the following discovery. A novolac resin comprising recurring units of the general structural formula (3) shown below is reacted with 1,2-naphthoquinonediazido-5-sulfonic acid chloride to introduce a specific proportion of 1,2-naphthoquinone-diazido-5-sulfonic acid residues into the novolac resin at its hydroxyl groups, thereby forming a photosensitive resin comprising recurring units of the general structural formula (1) shown below and having a weight average molecular weight of 1,300 to 11,000. If this reaction is effected in an organic solvent in the presence of a tertiary amine compound of the general structural formula (2) shown below, then a subsequent simple separation step can readily reduce the concentration of a salt of the tertiary amine compound. Since the tertiary amine compound is partially left in the resulting photosensitive resin, a desirable photosensitive resin composition is obtained without a need to add an extra base. The composition thus obtained has an appropriate concentration of the tertiary amine compound, but a minimized concentration of the hydrochloride salt of the tertiary amine compound co-present therewith, so that the composition is improved in sensitivity stability and free of the risk of causing the corrosion of metal substrates. While acting as a dehydrochlorination condensation reaction catalyst during the reaction, the specific tertiary amine compound of formula (2) also exerts a surface activating effect in the reaction system, enabling more uniform introduction of photosensitive groups into the novolac resin. This leads to a satisfactory resist composition which has minimized such problems as the formation of scum upon development. The composition comprising the photosensitive resin as a main component and the tertiary amine compound of formula (2) is improved in storage stability, substrate adhesion and heat resistance, and lends itself to the fabrication of electronic parts such as semiconductor devices, display devices (e.g., liquid crystal devices), and magnetic heads.

Accordingly, the present invention in a first aspect provides a photosensitive resin composition comprising a photosensitive resin comprising recurring units of the following general structural formula (1) and having a weight average molecular weight of 1,300 to 11,000, and a tertiary amine compound of the following general structural formula (2).

In a second aspect, the invention provides a process for preparing a photosensitive resin composition, comprising the step of reacting a novolac resin comprising recurring units of the following general structural formula (3) and having a weight average molecular weight of 1,000 to 10,000 with 1,2-naphthoquinonediazido-5-sulfonic acid chloride in an organic solvent in the presence of a tertiary amine compound of the following general structural formula (2).

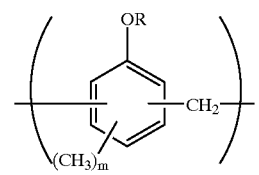

(1)

Herein, R is hydrogen or a 1,2-naphthoquinonediazido-5-sulfonic acid residue, the content of 1,2-naphthoquinone-diazido-5-sulfonic acid residue in R being 3 to 27 mol %, and m is a number from 0 to 3.

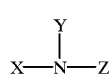

(2)

Herein, X is an alkyl, aryl or aralkyl group of 6 to 20 carbon atoms, Y and Z each are an alkyl group of 1 to 20 carbon atoms.

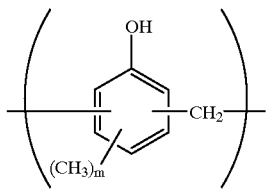

(3)

Herein, m is a number from 0 to 3.

According to the invention, a novolac resin comprising recurring units of formula (3) is reacted with 1,2-naphthoquinonediazido-5-sulfonic acid chloride using a tertiary amine compound of formula (2) as a basic catalyst. Then, by effecting a simple separation step on the reaction solution, the concentration of the salt of the tertiary amine compound remaining in the reaction solution can be reduced to a sufficient level to eliminate any detrimental influence such as the corrosion of metal substrates and to improve such performance factors as sensitivity stability and substrate adhesion. Without a need for cumbersome repetitive separation steps and an additional step of separately adding an extra basic compound, the invention is successful in producing through simple steps and in an industrially advantageous manner a photosensitive resin composition which has superior sensitivity stability and improved adhesion to substrates, and does not cause corrosion of metal substrates.

DESCRIPTION OF THE PREFERRED EMBODIMENTS

In the photosensitive resin composition of the invention, the main component is a photosensitive resin comprising recurring units of the following general structural formula (1) and having a weight average molecular weight of 1,300 to 11,000.

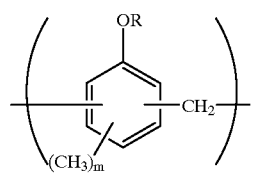

(1)

In formula (1), R is hydrogen or a 1,2-naphthoquinonediazido-5-sulfonic acid residue. The content of 1,2-naphthoquinonediazido-5-sulfonic acid residue is 3 to 27 mol % and preferably 4 to 20 mol % of the R groups. With a too low content of 1,2-naphthoquinonediazido-5-sulfonic acid residue, no patterns can be formed. A too high content results in a reduced sensitivity. Letter m is a number from 0 to 3.

The composition of the invention also contains a tertiary amine compound of the following general structural formula (2).

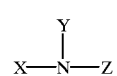

(2)

In formula (2), X is an alkyl, aryl or aralkyl group of 6 to 20 carbon atoms, Y and Z each are an alkyl group of 1 to 20 carbon atoms. More particularly, X is an alkyl, aryl or aralkyl group of 6 to 20 carbon atoms, preferably 6 to 16 carbon atoms, for example, alkyl groups such as octyl, lauryl and decyl, aryl groups such as phenyl, xylyl and naphthyl, and aralkyl groups such as benzyl and phenylethyl. Each of Y and Z is an alkyl group of 1 to 20 carbon atoms, preferably 1 to 16 carbon atoms, for example, methyl, ethyl, propyl, butyl and octyl.

Illustrative, non-limiting examples of the tertiary amine compound of formula (2) include dilaurylmonomethylamine, trioctylamine, dimethyloctylamine, dimethyldecylamine, dimethyllaurylamine, dimethylmyristylamine, and dimethylbenzylamine. These amine compounds may be used alone or in admixture of two or more.

An appropriate content of the tertiary amine compound of formula (2) is 20 to 5,000 parts, especially 25 to 2,000 parts by weight per million parts by weight of the entire composition. Too low a content of the tertiary amine compound may sometimes result in poor substrate adhesion and sensitivity stability whereas a too high content may cause the corrosion of metal substrates and detract from shelf stability.

An organic solvent is formulated in the composition if desired. The organic solvents used herein include ethylene glycol monoalkyl ethers and acetates thereof, propylene glycol monoalkyl ethers and acetates thereof, alkyl cellosolve acetates (e.g., ethyl cellosolve acetate), diethylene glycol mono- or di-alkyl ethers, lactic acid alkyl esters, alkoxypropionic acid alkyl esters, ketones (e.g., methyl isobutyl ketone and cyclohexanone), and acetic acid esters (e.g., butyl acetate). These organic solvents may be used alone or in admixture of two or more. The organic solvent may be either pre-blended in the photosensitive resin composition or post-blended at the time of use.

An appropriate amount of the organic solvent used is about 60 to 2,000 parts, and especially about 80 to 1,600 parts by weight per 100 parts by weight of the photosensitive resin, which means that the concentration of the photosensitive resin is about 5 to 60%, and especially about 10 to 50% by weight of the photosensitive resin composition.

Other various components may be added to the composition, if desired, insofar as the objects of the invention are not impaired. For example, surfactants including nonionic, fluorochemical and silicone surfactants are used for improving applicability, and various resins such as alkali-soluble resins are used for improving film strength and adjusting sensitivity.

According to the invention, the photosensitive resin composition is prepared by reacting a specific novolac resin with 1,2-naphthoquinonediazido-5-sulfonic acid chloride in an organic solvent in the presence of a tertiary amine compound of the general structural formula (2), pouring the reaction solution into water, and dissolving the resultant precipitate in an organic solvent again, followed by water washing once or twice.

The novolac resin used herein has recurring units of the following general structural formula (3):

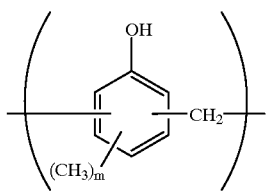

(3)

wherein m is a number from 0 to 3. The novolac resin has a weight average molecular weight of 1,000 to 10,000, and preferably 1,500 to 8,000. If the weight average molecular weight is too low, the resulting photosensitive resin composition has markedly inferior heat resistance and is practically unacceptable. If the weight average molecular weight is too high, the separation of the hydrochloride salt of the basic catalyst becomes difficult and insufficient whereby the resulting photosensitive resin composition worsens in storage stability and resolution.

The novolac resin of formula (3) can be synthesized by heating a hydroxy aromatic compound and an aldehyde in the presence of an acid catalyst to effect addition condensation. The hydroxy aromatic compounds used herein include m-cresol, p-cresol and mixtures thereof, xylenol isomers, trimethylphenol isomers, and mixtures thereof. The aldehydes used herein include formaldehyde, p-formaldehyde, acetaldehyde, and benzaldehyde, alone or mixtures thereof. It is preferred to use 0.3 to 3 mol, especially 0.3 to 1.5 mol of the aldehyde per mol of the hydroxy aromatic compound. With less amounts of the aldehyde, the resulting resin may have a lower degree of polymerization. With excessive amounts of the aldehyde, the resulting resin may have poor storage stability. The acid catalyst is typically selected from inorganic acids such as hydrochloric acid, nitric acid and sulfuric acid and organic acids such as formic acid, oxalic acid and acetic acid. The acid catalyst is used in a catalytic amount.

In effecting addition condensation between a hydroxy aromatic compound and an aldehyde in the presence of an acid catalyst, a hydrophilic solvent such as methanol, acetone or dioxane is preferably used. The reaction system is typically heated to a temperature of 50 to 150° C., especially 70 to 130° C. At the end of polymerization reaction, the unreacted reactants, catalyst and solvent are removed. To this end, the system is heated to a higher temperature of 130 to 230° C., and especially 150 to 200° C., at which volatiles are distilled off in vacuum, thereby recovering the desired novolac resin.

In turn, the novolac resin is reacted with 1,2-naphthoquinonediazido-5-sulfonic acid chloride. These reactants are used in such amounts that the quantity of 1,2-naphthoquinonediazido-5-sulfonic acid residue introduced into the novolac resin may be 3 to 27 mol %, especially 3 to 20 mol % based on the novolac resin. If the quantity of 1,2-naphthoquinonediazido-5-sulfonic acid residue introduced is too small, the resulting photosensitive resin composition may form a film with poor retentivity. If the quantity is too large, the resin becomes less soluble in solvents, resulting in a photosensitive resin composition which is less sensitive and less practical.

To the reaction system, a tertiary amine compound of formula (2) is added as the basic catalyst in an amount of 1.03 to 2 mol, especially 1.1 to 1.5 mol per mol of 1,2-naphthoquinonediazido-5-sulfonic acid chloride. If the amount of the tertiary amine compound added is too small, the introduction of 1,2-naphthoquinonediazido-5-sulfonic acid residue may not proceed to a sufficient extent. A too large amount may make it difficult or impossible to control the rate of exothermic reaction as desired and allow the tertiary amine compound to be left in the photosensitive resin composition in excess of the necessity.

Appropriate conditions may be selected for the reaction between the novolac resin and 1,2-naphthoquinone-diazido-5-sulfonic acid chloride in the presence of the tertiary amine compound of formula (2). Typically the reaction is effected in an organic solvent at a temperature of about 10 to 60° C., especially about 10 to 40° C. for a time of about 1 to 10 hours.

Examples of the organic solvent used herein include dioxane, methyl isobutyl ketone, ethyl acetate, cyclohexanone, γ-butyrolactone, and N,N-dimethylacetamide. The organic solvent is used in a solvent amount which may be determined without undue experimentation.

After the completion of reaction, the reaction solution is poured into water or diluted hydrochloric acid water whereupon the resin precipitates out. The precipitate is dissolved in an organic solvent such as ethyl acetate again and washed with water once or twice, yielding the end photosensitive resin composition.

In a prior art process of preparing a photosensitive resin having quinonediazidosulfonic acid groups introduced at hydroxyl groups on a novolac resin, condensation reaction is followed by removal of the basic promoter by-produced. The recovery of the photosensitive resin often requires a cumbersome procedure of repeating several times the steps of admitting the reaction solution into water or diluted hydrochloric acid water and dissolving the precipitated photosensitive resin in a solvent again. By contrast, the process of preparing a photosensitive resin composition according to the invention has several advantages. Due to the use of a specific tertiary amine as the reaction promoter, reaction proceeds quickly. By purifying the reaction solution through simple steps, the concentration of tertiary amine hydrochloride salt in the photosensitive resin composition can be reduced to a level of 10 ppm or lower at which corrosion and detrimental influence on the underlying substrate are substantially prohibited. Additionally, the tertiary amine compound of formula (2) is left in an effective concentration to ensure sensitivity stability and adhesion to substrates. Cumbersome repetitive separation steps and an additional step of separately adding an extra basic compound are not requisite.

The concentration of diluted hydrochloric acid, organic solvent and purifying conditions used in the purifying step may be the same as in a conventional purifying step. The organic solvent is preferably selected from the above-listed organic solvents which can be formulated in the inventive composition.

To the photosensitive resin composition thus obtained, if necessary, an extra amount of the tertiary amine compound of formula (2) may be added as well as other additives.

When a resist pattern is formed by applying the photosensitive resin composition to a substrate and irradiating radiation thereto, the method is not limited and any conventional method may be used. For example, a resist pattern is formed by spin coating the inventive composition in solution form onto a substrate such as a silicon wafer, prebaking the coating, and exposing the coating to UV radiation by a suitable exposure system such as a proximity aligner or stepper, followed by development and rinsing. The developer used herein may be aqueous solutions of inorganic bases such as sodium hydroxide and sodium carbonate and aqueous solutions of organic bases such as triethanolamine, tetramethylammonium hydroxide and choline.

There has been described a photosensitive resin composition which is improved in sensitivity stability and adhesion to substrates and eliminates the risk of causing corrosion of metal substrates. The composition is best suited for use in the fabrication of electronic parts such as semiconductor devices, display devices (e.g., liquid crystal devices), and magnetic heads. The method of the invention can effectively produce the photosensitive resin composition through simple steps.

EXAMPLE

Examples of the invention are given below by way of illustration and not by way of limitation.

Synthetic Example 1

Under light-shielded condition, a flask equipped with a stirrer, dropping funnel and thermometer was charged with 121 g of a cresol novolac resin derived from m-cresol and having a weight average molecular weight of 8,500, 13.44 g (0.05 mol) of 1,2-naphthoquinonediazido-5-sulfonic acid chloride, and 800 g of 1,4-dioxane, which were stirred until uniform. While the flask was kept at 25° C., 12.8 g (0.06 mol) of dimethyllaurylamine was added dropwise so that the internal temperature might not exceed 30° C. After the completion of dropwise addition, the reaction solution was heated to 40° C. and ripened for one hour at the temperature. The reaction solution was then poured into 5 liters of pure water. The resulting precipitate was collected by filtration, dissolved in 800 g of ethyl acetate, and washed once with pure water. Thereafter, the ethyl acetate was stripped off at 30° C., recovering 122 g of a product. The product contained a photosensitive resin (A) having structural units of formula (1) (wherein R is hydrogen or a 1,2-naphthoquinonediazido-5-sulfonic acid residue, the content of 1,2-naphthoquinonediazido-5-sulfonic acid residue is 5 mol %, and m=1) and having a weight average molecular weight of 9,400 and 480 ppm of dimethyllaurylamine.

Synthetic Example 2

Reaction was carried out as in Synthetic Example 1 except that the flask was charged with 122 g of a novolac resin derived from m-cresol/p-cresol/3,5-xylenol in a ratio of 5/4/1 and having a weight average molecular weight of 6,200, 26.9 g (0.10 mol) of 1,2-naphthoquinonediazido-5-sulfonic acid chloride, and 800 g of 1,4-dioxane, and 22.02 g (0.14 mol) of dimethyloctylamine was used as the tertiary amine. The reaction solution was poured into 5 liters of 0.05N aqueous hydrochloric acid. The resulting precipitate was collected by filtration, dissolved in 800 g of ethyl acetate, and washed twice with pure water. Thereafter, the ethyl acetate was stripped off at 30° C., recovering 120 g of a product. The product contained a photosensitive resin (B) having structural units of formula (1) (wherein R is hydrogen or a 1,2-naphthoquinonediazido-5-sulfonic acid residue, the content of 1,2-naphthoquinonediazido-5-sulfonic acid residue is 10 mol %, and m=1.1) and having a weight average molecular weight of 7,500 and 4,000 ppm of dimethyloctylamine.

Synthetic Example 3

Under light-shielded condition, a flask equipped with a stirrer, dropping funnel and thermometer was charged with 121 g of a cresol novolac resin derived from m-cresol and having a weight average molecular weight of 8,500, 13.44 g (0.05 mol) of 1,2-naphthoquinonediazido-5-sulfonic acid chloride, and 800 g of 1,4-dioxane, which were stirred until uniform. While the flask was kept at 25° C., 6.1 g (0.06 mol) of triethylamine was added dropwise so that the internal temperature might not exceed 30° C. After the completion of dropwise addition, the reaction solution was heated to 40° C. and ripened for one hour at the temperature. The reaction solution was then poured into 5 liters of pure water. The resulting precipitate was collected by filtration, dissolved in 800 g of ethyl acetate, and washed once with pure water. Thereafter, the ethyl acetate was stripped off at 30° C., recovering 122 g of a product. The product contained a photosensitive resin (C) having structural units of formula (1) (wherein R is hydrogen or a 1,2-naphthoquinonediazido-5-sulfonic acid residue, the content of 1,2-naphthoquinonediazido-5-sulfonic acid residue is 5 mol %, and m=1) and having a weight average molecular weight of 9,400 and 480 ppm of triethylamine.

Example 1

The product obtained in Synthetic Example 1 was dissolved in 360 g of ethyl cellosolve acetate to give a photosensitive resin composition. The quantities of residual hydrochloric acid and amine in the composition were measured by titration, finding 2 ppm of residual hydrochloric acid and 120 ppm of dimethyllaurylamine.

Example 2

The product obtained in Synthetic Example 2 was dissolved in 360 g of ethyl cellosolve acetate to give a photosensitive resin composition. The quantities of residual hydrochloric acid and amine in the composition were measured by titration, finding 3 ppm of residual hydrochloric acid and 3,000 ppm of dimethyloctylamine.

Comparative Example 1

The product obtained in Synthetic Example 3 was dissolved in 360 g of ethyl cellosolve acetate to give a photosensitive resin composition (outside the scope of the invention). The quantities of residual hydrochloric acid and amine in the composition were measured by titration, finding 130 ppm of residual hydrochloric acid and 120 ppm of triethylamine.

Each of the photosensitive resin composition solutions in Examples and Comparative Example was passed through a 0.2-μm membrane filter and examined by the following tests. The results are shown in Table 1.

Sensitivity stability

The solution was spin coated onto a silicon wafer which had been pretreated with hexamethyldisilazane (HMDS). The coating was prebaked on a hot plate at 90° C. for 90 seconds to form a film of 1.5 μm thick. The film was exposed to i-line by means of an aligner NSR-1755i7A (Nikon K.K.), developed with a 2.38% aqueous solution of tetramethylammonium hydroxide, and rinsed with pure water. An optimum exposure (or initial sensitivity) was determined. Separately, the solution was kept at room temperature for 3 months whereupon an optimum exposure (or sensitivity after 3 months) was similarly determined. From the initial sensitivity and the sensitivity after 3 months, sensitivity stability was evaluated.

Aluminum corrosion

On a wafer having an aluminum film of 10,000 angstroms formed thereon, a resist was patterned by the same procedure as above. The unexposed area of the resist was peeled using N-methyl-2-pyrrolidone whereupon the exposed aluminum surface was observed for luster to inspect aluminum corrosion.

Adhesion

On a silicon nitride film as the substrate, a resist was patterned by the same procedure as above. The resist was post-baked on a hot plate at 100° C. for 3 minutes, following which the structure was immersed in buffered hydrofluoric acid for 20 minutes for etching the nitride film. The minimum line dimension in the remaining pattern of resist was measured for evaluating adhesion.

TABLE 1

|  | EX1 | EX2 | CE1 |
| --- | --- | --- | --- |
| Photosensitive resin | (A) | (B) | (C) |
| Residual HCl, ppm | 2 | 3 | 130 |
| Residual amine, ppm | dimethyl-laurylamine, 120 | dimethyl-octylamine, 1000 | triethyl-amine, 120 |
| Initial sensitivity (mJ/cm$^2$) | 230 | 210 | 230 |
| Sensitivity after 3 months (mJ/cm$^2$) | 230 | 210 | 210 |
| Aluminum corrosion | nil | nil | corroded |
| Adhesion (μm) | 1 | 1 | 5 |

Japanese Patent Application No. 11-004528 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A photosensitive resin composition comprising
   a photosensitive resin comprising recurring units of the following general structural formula (1) and having a weight average molecular weight of 1,300 to 11,000,

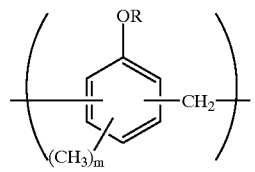

(1)

wherein R is hydrogen or a 1,2-naphthoquinonediazido-5-sulfonic acid residue, the content of 1,2-naphthoquinonediazido-5-sulfonic acid residue in R being 3 to 27 mol %, and m is a number from 0 to 3, and
   a tertiary amine compound of the following general structural formula (2):

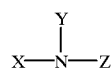

(2)

wherein X is an alkyl, aryl or aralkyl group of 6 to 20 carbon atoms, Y and Z each are an alkyl group of 1 to 20 carbon atoms.

2. The photosensitive resin composition of claim 1 further comprising an organic solvent.

3. A process for preparing a photosensitive resin composition, comprising the step of reacting a novolac resin with 1,2-naphthoquinonediazido-5-sulfonic acid chloride in an organic solvent in the presence of a tertiary amine compound,
   said novolac resin comprising recurring units of the following general structural formula (3):

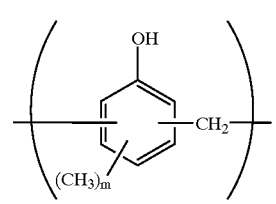

(3)

wherein m is a number from 0 to 3, and having a weight average molecular weight of 1,000 to 10,000, and
   said tertiary amine compound being of the following general structural formula (2):

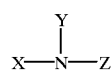

(2)

wherein X is an alkyl, aryl or aralkyl group of 6 to 20 carbon atoms, Y and Z each are an alkyl group of 1 to 20 carbon atoms.

* * * * *